United States Patent
Luo

(10) Patent No.: US 12,028,043 B2
(45) Date of Patent: Jul. 2, 2024

(54) PACKAGING METHOD AND PACKAGING STRUCTURE OF FBAR

(71) Applicant: Ningbo Semiconductor International Corporation, Ningbo (CN)

(72) Inventor: Hailong Luo, Ningbo (CN)

(73) Assignee: Ningbo Semiconductor International Corporation, Ningbo (CN)

( * ) Notice: Subject to any disclaimer, the term of this patent is extended or adjusted under 35 U.S.C. 154(b) by 436 days.

(21) Appl. No.: 17/249,347

(22) Filed: Feb. 26, 2021

(65) Prior Publication Data

US 2021/0194456 A1 Jun. 24, 2021

Related U.S. Application Data

(63) Continuation of application No. PCT/CN2019/107176, filed on Sep. 23, 2019.

(30) Foreign Application Priority Data

Jul. 19, 2019 (CN) .......................... 201910657418.2

(51) Int. Cl.
*H03H 9/10* (2006.01)
*H03H 3/02* (2006.01)
(Continued)

(52) U.S. Cl.
CPC .............. *H03H 9/105* (2013.01); *H03H 3/02* (2013.01); *H03H 9/0523* (2013.01); *H03H 9/173* (2013.01); *H03H 2003/021* (2013.01)

(58) Field of Classification Search
CPC ...... H03H 9/105; H03H 9/1007; H03H 9/173; H03H 9/15; H03H 3/02; H03H 2003/021
See application file for complete search history.

(56) References Cited

U.S. PATENT DOCUMENTS

| | | | | |
|---|---|---|---|---|
| 7,282,388 B2* | 10/2007 | Kwon | ............... | H03H 9/173 438/106 |
| 8,303,755 B2* | 11/2012 | Ichikawa | ............... | H01L 23/055 156/252 |

(Continued)

FOREIGN PATENT DOCUMENTS

| CN | 102571026 A | 7/2012 |
|---|---|---|
| CN | 104767500 A | 7/2015 |

(Continued)

*Primary Examiner* — Jeffrey T Carley
(74) *Attorney, Agent, or Firm* — Anova Law Group, PLLC

(57) ABSTRACT

The present disclosure provides a packaging method and packaging structure of an FBAR. A second cavity in a resonator cover provided includes a groove in a second substrate and a space surrounded by an elastic bonding material layer. The elastic bonding material layer bonds the resonator cover to a resonant cavity main structure, and elasticity of the elastic bonding material layer is removed after the bonding. Through holes and a conductive interconnection layer on inner surfaces of the through holes are formed on the resonator cover. Since the second cavity includes the groove in the second substrate and the space surrounded by the elastic bonding material layer, which can avoid problems that performance of the elastic bonding material layer is unstable with temperature and humidity changes when the second cavity is entirely surrounded by the elastic bonding material layer, that is, the stability of the resonator is improved.

16 Claims, 3 Drawing Sheets

(51) Int. Cl.
  *H03H 9/05*   (2006.01)
  *H03H 9/17*   (2006.01)

(56) References Cited

U.S. PATENT DOCUMENTS

| | | | | |
|---|---|---|---|---|
| 9,646,874 B1* | 5/2017 | Wojciechowski | ........................... | |
| | | | H01L 21/30604 | |
| 2002/0121337 A1* | 9/2002 | Whatmore | ............ H03H 9/105 | |
| | | | 156/292 | |
| 2005/0218755 A1* | 10/2005 | Song | .................. H03H 9/173 | |
| | | | 310/348 | |
| 2008/0283944 A1* | 11/2008 | Geefay | ............... B81C 1/00595 | |
| | | | 257/416 | |
| 2009/0134957 A1* | 5/2009 | Shin | ...................... H03H 9/173 | |
| | | | 333/187 | |
| 2009/0315430 A1* | 12/2009 | Tsuda | .................. H03H 9/1092 | |
| | | | 29/25.35 | |
| 2010/0182101 A1* | 7/2010 | Suzuki | ................. H03H 9/1085 | |
| | | | 333/193 | |
| 2010/0301703 A1* | 12/2010 | Chen | ................. H03H 9/02244 | |
| | | | 29/25.35 | |
| 2012/0032561 A1* | 2/2012 | Mizusawa | ............ H03H 9/0595 | |
| | | | 310/344 | |
| 2014/0132368 A1* | 5/2014 | Tsuda | ...................... H01L 24/97 | |
| | | | 333/193 | |
| 2015/0145610 A1* | 5/2015 | Ruby | ....................... H03B 5/36 | |
| | | | 310/313 R | |
| 2017/0179919 A1* | 6/2017 | Yang | ................. H03H 9/02007 | |
| 2018/0123553 A1* | 5/2018 | Park | .................. H03H 9/02007 | |
| 2018/0183406 A1* | 6/2018 | Patil | ....................... H03H 9/173 | |
| 2018/0309422 A1* | 10/2018 | Shealy | ................ H10N 30/877 | |
| 2019/0379349 A1* | 12/2019 | Lee | ........................ H03H 9/105 | |
| 2021/0218381 A1* | 7/2021 | Luo | .......................... H03H 9/17 | |
| 2021/0242855 A1* | 8/2021 | Luo | ...................... H03H 9/1007 | |

FOREIGN PATENT DOCUMENTS

| | | | |
|---|---|---|---|
| CN | 106130500 A | 11/2016 | |
| CN | 107181472 A | 9/2017 | |
| CN | 109586680 A | 4/2019 | |
| JP | H08267764 A | 10/1996 | |
| JP | 2004503164 A | 1/2004 | |
| JP | 2006351591 A | 12/2006 | |
| JP | 2008085562 A | 4/2008 | |
| JP | 2012104908 A | 5/2012 | |
| WO | WO-2005104361 A1 * | 11/2005 | ........... H03H 3/0072 |

* cited by examiner

PACKAGING METHOD AND PACKAGING STRUCTURE OF FBAR

CROSS-REFERENCE TO RELATED APPLICATIONS

This application is a continuation application of PCT Patent Application No. PCT/CN2019/107176, filed on Sep. 23, 2019, which claims priority to Chinese patent application No. 201910657418.2, filed on Jul. 19, 2019, the entirety of all of which is incorporated herein by reference.

FIELD OF THE DISCLOSURE

The present disclosure generally relates to the field of radio frequency product packaging technology and, more particularly, relates to a packaging method and packaging structure of a film bulk acoustic resonator (FBAR).

BACKGROUND

A film bulk acoustic resonator (FBAR) includes electrodes that are typically disposed above and/or below a piezoelectric layer. In response to a high frequency signal applied to the electrodes, the piezoelectric layer can oscillate. The FBAR can be used in a wireless signal transmission system to realize wireless data input and/or output. For example, The FBAR can be used in wireless communication devices, wireless power transmitters, and wireless sensors' filters, transmitters, receivers, duplexers, etc.

Referring to FIG. 1, an existing packaging process of an FBAR usually includes the following steps.

(1) A silicon dioxide layer 200 is grown on a carrier wafer (not shown) through a thermal oxidation process or a chemical vapor deposition process, and a photolithography and etching process is further used to etch and remove a portion of a thickness of the silicon dioxide layer 200 to form a second cavity 2001.

(2) Through an Au—Au bonding process, the carrier wafer with the second cavity 2001 is bonded with a prefabricated resonant cavity main structure with a first cavity 1011, a bulk acoustic resonant structure 102, and a first substrate 100. At this time, the second cavity 2001 is aligned with the first cavity 1011, and the bulk acoustic resonant structure 102 is sandwiched between the second cavity (also called an upper cavity) 2001 and the first cavity (also called a lower cavity) 1011. Generally, a lower cavity wall 101 is formed on the prefabricated first substrate 100, and the bulk acoustic resonant structure 102 includes a first electrode (also called a lower electrode) 1021, a piezoelectric layer 1022, and a second electrode (also called an upper electrode) 1023, stacked in the first cavity. The lower cavity wall 101 is used to form the first cavity 1011 between the first substrate 100 and the first electrode 1021. Alternatively, the Au—Au bonding process includes: first forming a gold layer 201 required to form a bonding on the silicon dioxide layer 200 at a periphery of the second cavity 2001, and a gold layer 103 required to form the bonding on the first electrode 1021 and the second electrode 1023 at a periphery of the first cavity 1011, by using a metal lift-off technology; and then, after the first cavity 1011 and the second cavity 2001 are aligned with each other, forming the Au—Au bonding by melting the gold layer 201 and the gold layer 103 through heating. The metal lift-off technology refers to: after a substrate is coated with a photoresist film, exposed, and developed, by using the photoresist film with a certain pattern as a mask, evaporating required metal on the substrate with the photoresist film; and then, while removing the photoresist film, stripping; clean the metal on the photoresist film and leaving only the metal of the required pattern on the substrate.

(3) Using a backside thinning process, the carrier wafer in the structure after the bonding is removed, so that the remaining silicon dioxide layer 200 is used as a cover plate, and the silicon dioxide layer 200 is perforated to form holes 203 to expose a surface of the bonded gold.

(4) A copper metal layer 204 is electroplated on surfaces of the silicon dioxide layer 200 and the holes 203, and the copper metal layer 204 is patterned by photolithography, etching and other processes to form wires to lead the second electrode 1023 and the first electrode 1021 outward.

(5) A passivation layer 205 is deposited on the silicon dioxide layer 200 and the copper metal layer 204, the passivation layer 205 is patterned through processes such as photolithography and corrosion to expose a portion of the copper metal layer 204 as metal pads, and further solder balls are formed at the exposed copper metal layer 204, so as the formed solder balls 206 are in contact with the metal pads.

In the packaging process of the above-mentioned FBAR, the silicon dioxide layer needs to be deposited and etched on the carrier wafer, the Au—Au bonding process is required to bond the first cavity 1011 and the second cavity 2001 together, and the carrier wafer needs to be removed after the bonding, so the process is complicated and equipment cost is high. And because the Au—Au bonding process introduces the gold element, there are problems of high material cost and element pollution to production lines. In addition, the passivation layer 205 in the above process is usually formed by depositing a thinner layer of a commonly used passivation layer material such as silicon oxide, silicon nitride, etc., which will result in gaps in the holes 203, thereby making sidewalls of the second cavity 2001 thin, such that mechanical strength of an upper cavity cover is insufficient which will cause reliability risk of the device.

BRIEF SUMMARY OF THE DISCLOSURE

One aspect of the present disclosure provides a packaging method of a film bulk acoustic resonator, including: providing a resonant cavity main structure, that the resonant cavity main structure includes a first substrate and a bulk acoustic resonant structure formed on the first substrate, and a first cavity is formed between the bulk acoustic resonant structure and the first substrate; providing a resonator cover with a second cavity, that the resonator cover includes a second substrate with a groove, and an elastic bonding material layer covering a surface of the second substrate at a periphery of the groove, and the second cavity includes the groove and a space surrounded by the elastic bonding material layer; bonding the resonant cavity main structure and the resonator cover together through the elastic bonding material layer, and removing elasticity of the elastic bonding material layer, that after the bonding, the bulk acoustic resonant structure is sandwiched between the first substrate and the second substrate, and the groove is at least partially aligned with the first cavity; forming through holes penetrating the resonator cover and exposing corresponding electrical connection portions of the bulk acoustic resonant structure; and forming a conductive interconnection layer on surfaces of the through holes and on a portion of a surface of the resonator cover at a periphery of the through holes.

Another aspect of the present disclosure provides a packaging structure of a film bulk acoustic resonator, including:

a resonant cavity main structure, that the resonant cavity main structure includes a first substrate and a bulk acoustic resonant structure formed on the first substrate, and a first cavity is formed between the first substrate and the bulk acoustic resonant structure; a resonator cover, that the resonator cover includes an elastic bonding material layer with elasticity removed and a second substrate with a groove, the elastic bonding material layer is sandwiched between the bulk acoustic resonant structure and the second substrate and is located at a periphery of the groove, the groove is at least partially aligned with the first cavity, the resonator cover has a second cavity and through holes, the second cavity includes a space surrounded by the elastic bonding material layer and the groove, and the through holes penetrate the resonator cover at a periphery of the second cavity and expose corresponding electrical connection portions of the bulk acoustic resonant structure; and a conductive interconnection layer formed on surfaces of the through holes and on a portion of a surface of the resonator cover at a periphery of the through holes.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

The technical solutions of the present disclosure will be further described in detail below in conjunction with the drawings and embodiments. According to the following description, the advantages and features of the present disclosure will be clearer. It should be noted that the drawings are in a very simplified form and all use imprecise proportions, which are only used to conveniently and clearly assist in explaining the purpose of the embodiments of the present disclosure. Similarly, if the method described herein includes a series of steps, and an order of these steps presented herein is not necessarily the only order in which these steps can be performed, and some of the described steps may be omitted and/or some other steps that are not described herein can be added to the method. If components in a certain drawing are the same as those in other drawings, although these components can be easily identified in all the drawings, to make the description of the drawings clearer, this specification will not show reference numbers of all the same components in each figure.

Figure 1:
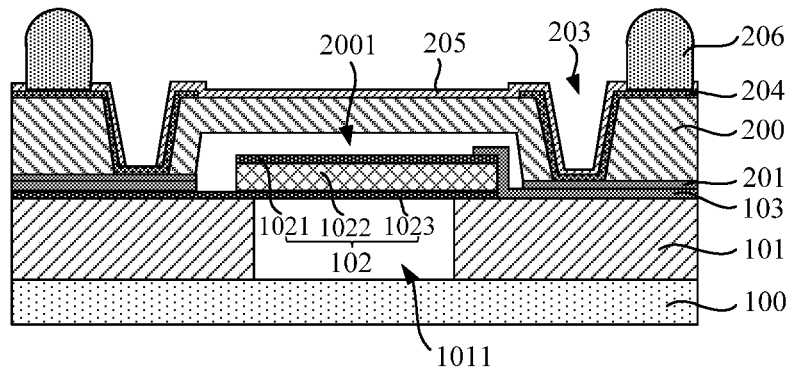
FIG. 1 illustrates a schematic cross-sectional structure diagram of an existing typical packaging structure of an FBAR.
Figure 2:
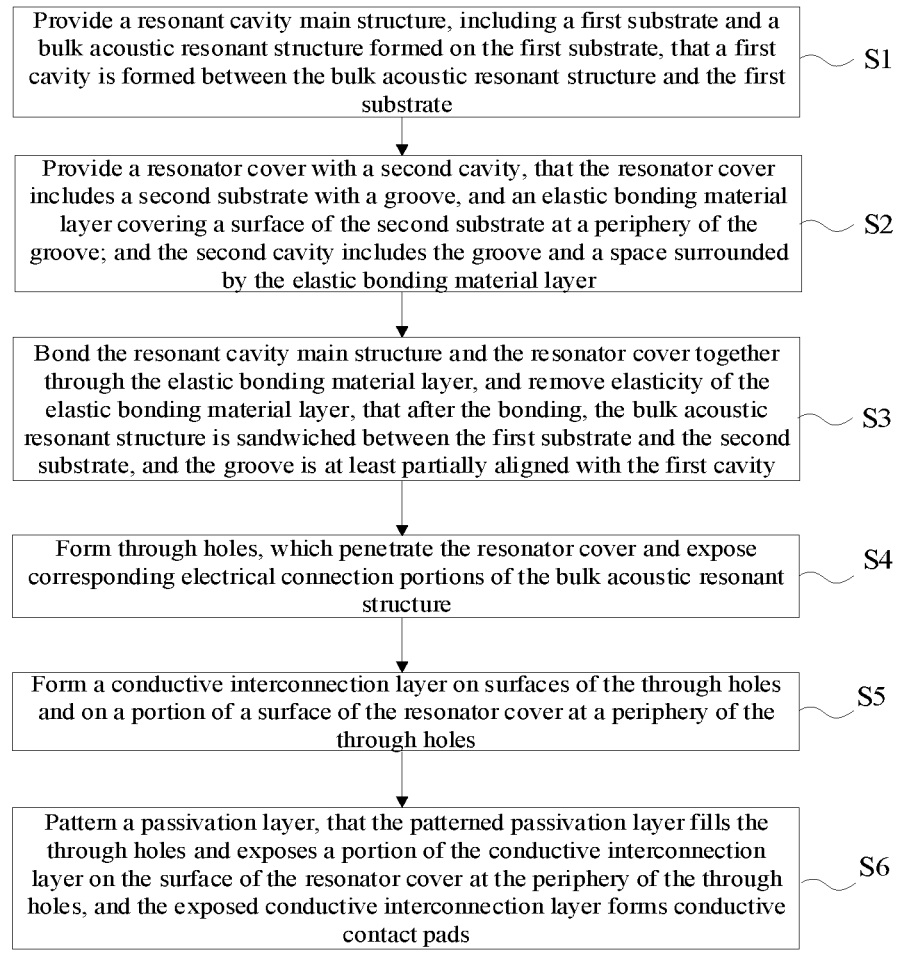
FIG. 2 illustrates a flowchart of an exemplary packaging method of an FBAR according to some embodiments of the present disclosure.

Referring to FIG. 2, the present disclosure provides a packaging method of an FBAR, which includes the following steps:

S1, providing a resonant cavity main structure, including a first substrate and a bulk acoustic resonant structure formed on the first substrate, and a first cavity is formed between the bulk acoustic resonant structure and the first substrate;

S2, providing a resonator cover with a second cavity, that the resonator cover includes a second substrate with a groove, and an elastic bonding material layer covering a surface of the second substrate at a periphery of the groove; and the second cavity includes the groove and a space surrounded by the elastic bonding material layer;

S3, bonding the resonant cavity main structure and the resonator cover together through the elastic bonding material layer, and removing elasticity of the elastic bonding material layer, that after the bonding, the bulk acoustic resonant structure is sandwiched between the first substrate and the second substrate, and the groove is at least partially aligned with the first cavity;

S4, forming through holes, which penetrate the resonator cover and expose corresponding electrical connection portions of the bulk acoustic resonant structure;

S5, forming a conductive interconnection layer on surfaces of the through holes and on a portion of a surface of the resonator cover at a periphery of the through holes; and S6, patterning a passivation layer, that the patterned passivation layer fills the through holes and exposes a portion of the conductive interconnection layer on the surface of the resonator cover at the periphery of the through holes, and the exposed conductive interconnection layer forms conductive contact pads.

Figure 3A:
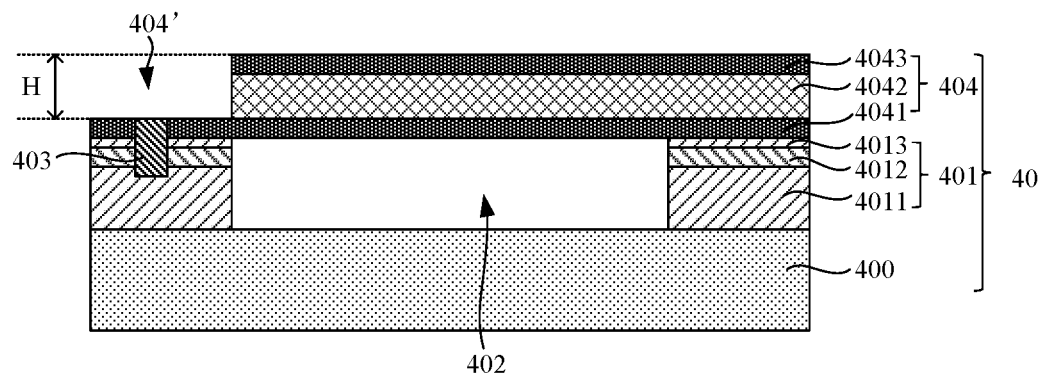
FIGS. 3A to 3E illustrate schematic cross-sectional structural diagrams of an exemplary packaging method of an FBAR according to some embodiments of the present disclosure.

Referring to FIG. 3A, in step S1, a first substrate 400 is provided, and a first cavity 402 and a bulk acoustic resonant structure 404 are formed on the first substrate 400 to form a resonant cavity main structure 40.

In an alternative implementation, the resonant cavity main structure 40 can be formed by the following method.

First, a carrier substrate is provided, and an etching stop layer (not shown) is formed on the carrier substrate. The carrier substrate can be any suitable substrate known to those skilled in the art, such as a bare silicon wafer or a ceramic substrate, a quartz or glass substrate, etc. The etching stop layer may be formed on the carrier substrate by a suitable deposition method (such as chemical vapor deposition, physical vapor deposition, or atomic layer deposition) or a thermal oxidation method. A material of the etching stop layer includes but is not limited to at least one of silicon oxide, silicon nitride, silicon oxynitride, fluorocarbon (CF), carbon-doped silicon oxide (SiOC), silicon carbonitride, and other materials. The etching stop layer can serve as a process stopping point in a process to subsequently remove the carrier substrate, to protect the bulk acoustic resonant structure. A thickness of the etching stop layer is, for example, about 1000 Å to about 10000 Å. In some other embodiments of the present disclosure, the etching stop layer can also be a removable film material such as photo-curable glue or hot melt glue, which can be removed when the carrier substrate is subsequently removed.

Then, a second electrode material layer (not shown) for forming a second electrode 4043, a piezoelectric material layer for forming a piezoelectric layer 4042, and a first electrode material layer for forming a first electrode 4041, can be sequentially covered on a surface of the etching stop layer by any suitable method known to those skilled in the art such as evaporation, magnetron sputtering, etc., to form film layers for forming the bulk acoustic resonant structure 404. Materials of the first electrode material layer and the second electrode material layer include but are not limited to at least one metal of Ag, Au, Cu, Pd, Cr, Mo, Ti, Ta, Sn, W, and Al. The piezoelectric layer 4042 can be made of piezoelectric materials with wurtzite crystal structure such as ZnO, AlN, GaN, lead zirconate titanate, lead titanate, and the like. A thickness of the piezoelectric material layer can be set according to a target resonance frequency, and can be optionally set to be about ½ of a wavelength. In some embodiments, a Mo metal film is used as the first electrode material layer and the second electrode material layer, and a thickness of the Mo metal film is usually about 2000 Å to about 1 AlN is used as the piezoelectric material layer, and a thickness of AlN is usually about 2000 Å to about 2 In some other embodiments of the present disclosure, the bulk acoustic resonant structure to be formed may also include other film layers other than the above-mentioned several film layers, which can be reasonably set according to actual device requirements, and there is no specific limitation here.

Then, a third lower cavity wall layer 4013 and a second lower cavity wall layer 4012 can be sequentially formed on the first electrode material layer by a suitable deposition method (such as chemical vapor deposition, physical vapor deposition or atomic layer deposition, etc.) or a thermal oxidation process. The third lower cavity wall layer 4013 may be silicon oxide, and the second lower cavity wall layer 4012 may be silicon nitride or silicon oxynitride. The third lower cavity wall layer 4013 can be used as an etching stop point when a first lower cavity wall layer 4011 is subsequently etched to form the first cavity 402, which can protect the first electrode material layer from unnecessary damage. The second lower cavity wall layer 4012 can be used as a hard mask layer in a subsequent alignment mark opening process, which is beneficial to improve accuracy of a formed alignment mark opening.

Next, exposure, development, and etching processes, are performed to sequentially etch the second lower cavity wall layer 4012, the third lower cavity wall layer 4013, the first electrode material layer, the piezoelectric material layer, and the second electrode material layer. The etching stops on a surface of the carrier substrate (if the etching stop layer is formed, it stops on the etching stop layer on the surface of the carrier substrate), thereby forming a corresponding alignment mark opening (not shown). A shape of a cross section (a plane parallel to the surface of the carrier substrate) of the alignment mark opening can be a circle, a cross, an ellipse, a polygon, a grating, etc. A shape of a longitudinal section of the alignment mark opening (a plane vertical to the surface of the carrier substrate) can be rectangular, U-shaped, regular trapezoid or inverted trapezoid, etc. A position of the alignment mark opening is generally set at a periphery of the first cavity 402 to be formed, for example, on an outside of a contact area of the first electrode and a contact area of the second electrode of the FBAR. In an alternative implementation, it may be set on only one outer side of the FBAR to be formed, or be arranged on two outer sides of the FBAR in an axisymmetric or center-symmetric manner.

Then, the first lower cavity wall layer 4011 can be deposited by a suitable deposition method (such as chemical vapor deposition, physical vapor deposition, or atomic layer deposition, etc.) to fill the alignment mark opening and cover the second lower cavity wall layer 4012. The deposited first lower cavity wall layer 4011 not only can fill the alignment mark opening, but also needs to have a sufficient thickness above the second lower cavity wall layer 4012 to be used to subsequently form the first cavity 402 with a required depth. In some embodiments, the first lower cavity wall layer 4011 is silicon oxide, which can be made of TEOS or PEOX, and a thickness is selected to be about 0.5 μm to about 4 After covering the first lower cavity wall layer 4011, a top of the first lower cavity wall layer 4011 may be flattened (for example, by using a chemical mechanical polishing process) to make the top surface flat. Thus, on one hand, it is beneficial to improve process accuracy of the first cavity formed subsequently and uniformity of a depth of the first cavity, and on another hand, it is beneficial to a subsequent bonding of the first substrate 400. As shown in FIG. 3A, a portion of the first lower cavity wall layer 4011 filled in the alignment mark opening forms an alignment mark 403. The alignment mark is used for subsequent alignment of a second substrate 300 and the first substrate 400 to improve alignment accuracy. The first lower cavity wall layer 4011 to the third lower cavity wall layer 4013 constitute a support layer for forming the first cavity 402.

Next, exposure, development, and etching processes are performed to etch the first lower cavity wall layer 4011 to the third lower cavity wall layer 4013 to form the first cavity 402, and the first lower cavity wall layer 4011 to the third lower cavity wall layer 4013 collectively serves as a cavity wall surrounding the first cavity 402. A cross-section of the first cavity 402 (a cross-section parallel to the surface of the carrier substrate) may be a polygon such as a rectangle or a pentagon, or may be a circle, an ellipse, or the like. When it is necessary to fabricate multiple FBARs on a same substrate, multiple first cavities 402 can be formed at a same time, adjacent first cavities 402 are isolated by stacked structures of the remaining first lower cavity wall layer 4011 to the third lower cavity wall layer 4013, and the remaining first lower cavity wall layer 4011 to the remaining third lower cavity wall layer 4013 around the first cavities 402 serve as subsequent supporting structures for supporting bulk acoustic resonant structures. The first lower cavity wall layer 4011, the second lower cavity wall layer 4012, and the third lower cavity wall layer 4013 constitute an ONO (oxide layer-silicon nitride-oxide layer) structure, and the stacked ONO structure has low defects, that the second lower cavity wall layer 4012 made of silicon nitride can trap charges and suppress leakage currents. A depth of the first cavity 402 is, for example, about 0.5 μm to about 4 μm.

Next, the first substrate 400 is provided. The first substrate 400 may be any suitable carrier material known to those skilled in the art, for example, at least one of the following materials: Si, Ge, SiGe, SiC, SiGeC, InAs, GaAs, InP, or other III/V compound semiconductors, including multilayer structures composed of these semiconductors, or silicon-on-insulator (SOI), silicon-on-insulator (SSOI), germanium-on-insulator Silicon (S—SiGeOI), silicon germanium-on-insulator (SiGeOI), germanium-on-insulator (GeOI), or double-side polished silicon wafers (DSP), or ceramic substrates, quartz or glass substrates, etc., such as alumina, etc.

Then, the first substrate 400 can be bonded to the first lower cavity wall layer 4011 by any suitable bonding process known to those skilled in the art. For example, a side of the first lower cavity wall layer 4011 facing away from the carrier substrate can be bonded to the first substrate 400 by coating hot melt adhesive on the first substrate 400, etc. As a result, the first cavity 402 is enclosed between the first substrate 400 and the first electrode material layer for forming the first electrode 4041. For another example, vacuum bonding is used to bond the first substrate 400 to the first lower cavity wall layer 4011. Conditions of the vacuum bonding process include: a bonding pressure of about 1 Pa to about $10^5$ Pa and a bonding temperature of about 150° C. to about 200° C.

Then, according to material characteristics of the carrier substrate, a suitable process can be selected to remove the carrier substrate. For example, when the carrier substrate is a bare silicon wafer, the carrier substrate can be removed by a CMP process or a CMP process combined with a wet etching process.

Then, the entire structure is inverted so that the first substrate 400 is underneath, and the second electrode material layer for forming the second electrode 4043 is on top, and the first electrode material layer, the piezoelectric material layer, and the second electrode material layer or the second electrode material layer, the piezoelectric material layer, and the first electrode material layer are patterned in sequence, through exposure, development, and etching processes, to define the first electrode 4041 (that is, the remaining first electrode material layer, also called a lower electrode), the piezoelectric layer 4042 (that is, the remaining piezoelectric material layer), and the second electrode 4043 (that is, the remaining second electrode material layer, also called an upper electrode), thereby forming the bulk acoustic resonant structure 404. In this process, a portion of the second electrode material layer in the bulk acoustic resonant structure 404 on a side of a periphery of the first cavity 402, the piezoelectric material layer underneath, and a portion of the alignment mark 403, can be etched and removed at a same time to expose the first electrode 4041, so as to form an opening 404'. A top view shape of the opening 404' is semi-annular or closed-loop, so that a stepped bulk acoustic resonant structure 404 is formed at the periphery of the first cavity 402, and a step height is uniform, and marked as H. It should be noted that, in some other embodiments of the present disclosure, before forming the third lower cavity wall layer 4013 on the film layers for forming the bulk acoustic resonant structure 404, the film layers for forming the bulk acoustic resonant structure 404 are patterned to form the bulk acoustic resonant structure 404.

So far, the process of providing the resonant cavity main structure 40 in step S1 is completed.

In some other embodiments of the present disclosure, instead of using the carrier substrate, a sacrificial layer may be used to directly form the first cavity 402 and the bulk acoustic resonant structure 404 on the first substrate 400 to obtain the resonant cavity main structure 40. An alternative process includes the following steps.

First, a portion of a thickness in a partial area of the first substrate 400 is removed by etching to form a groove (not shown) for forming the first cavity 402. The first substrate 400 may include a base substrate (not shown), and at least one thin film (not shown) covering the base substrate (not shown), or a bare chip made of a semiconductor material.

Then, the first cavity 402 is filled with a sacrificial layer (not shown), a top surface of the sacrificial layer is flush with a top surface of the first substrate 400, or may be higher than the top surface of the first substrate 400, or may also be slightly lower than the top surface of the first substrate 400. The sacrificial layer may have a single-layer structure or a stacked-layer structure.

After that, the top surfaces of the first substrate 400 and the sacrificial layer are sequentially covered with the first electrode material layer (not shown) for forming the first electrode 4041, the piezoelectric material layer for forming the piezoelectric layer 4042, and the second electrode material layer for forming the second electrode 4043. The first electrode material layer, the piezoelectric material layer, and the second electrode material layer, or the second electrode material layer, the piezoelectric material layer, and the first electrode material layer, are sequentially patterned through processes such as exposure, development, and etching, to define the first electrode 4041, the piezoelectric layer 4042, and the second electrode 4043, thereby forming the bulk acoustic resonant structure 404.

Then, a release hole (not shown) is opened on the bulk acoustic resonant structure 404 in a region of the first cavity 402 near an edge, and the sacrificial layer is removed by introducing an etchant into the release hole to re-empty the groove. Thus, the first cavity 402 between the bulk acoustic resonant structure 404 and the first substrate 400 is obtained. The first cavity 402 is a groove structure with an entire bottom recessed in the first substrate 400. So far, the process of providing the resonant cavity main structure 40 in step S1 is completed.

In some other embodiments of the present disclosure, another method of using a sacrificial layer to directly form the first cavity 402 and the bulk acoustic resonant structure 404 on the first substrate 400 to obtain the resonant cavity main structure 40 can also be provided. An alternative process includes the following steps.

First, a sacrificial layer (not shown) is fully covered on the first substrate 400. The sacrificial layer may be a single-layer structure or a stacked-layer structure.

Then, exposure, development, and etching processes are performed to etch and patten the sacrificial layer to form a patterned sacrificial layer for forming the first cavity 402.

Next, top surfaces of the first substrate 400 and the sacrificial layer are sequentially covered with the first electrode material layer (not shown) for forming the first electrode 4041, the piezoelectric material layer for forming the piezoelectric layer 4042, and the second electrode material layer for forming the second electrode 4043. The first electrode material layer, the piezoelectric material layer, and the second electrode material layer, or the second electrode material layer, the piezoelectric material layer, and the first electrode material layer, are sequentially patterned through processes such as exposure, development, and etching, to define the first electrode 4041, the piezoelectric layer 4042, and the second electrode 4043, thereby forming the bulk acoustic resonant structure 404.

Then, a release hole (not shown) can be opened on an edge area of the bulk acoustic resonant structure 404, and the sacrificial layer can be removed by introducing an etchant into the release hole, thereby obtaining the first cavity 402 between the bulk acoustic resonant structure 404 and the first substrate 400. The first cavity 402 is protruding on the first substrate 400. So far, the process of providing the resonant cavity main structure 40 in step S1 is completed.

In addition, it should be noted that when the first substrate 400 is a wafer, a number of bulk acoustic resonant structures 404 on the first substrate 400 is not limited to one, that is, a plurality of bulk acoustic resonant structures 404 can be formed on the first substrate 400 at a same time. A first cavity 402 is provided between each bulk acoustic resonant structure 404 and the first substrate 400, and adjacent first cavities 402 can be separated by a lower cavity wall 401. Adjacent bulk acoustic resonant structures 404 may be disconnected from each other, or some of the film layers may be connected together.

Figure 3B:
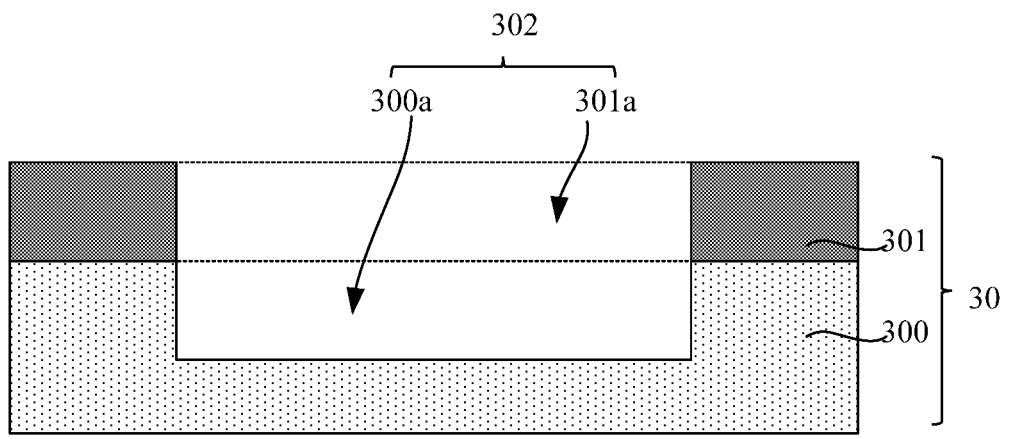

Referring to FIG. 3B, in step S2, first, a second substrate 300 is provided. The second substrate 300 may be a substrate including a silicon base substrate, such as a bulk silicon substrate, a silicon-on-insulator substrate, or a substrate composed of a silicon base substrate and a silicon dioxide layer laminated on the silicon base substrate (the silicon dioxide layer is arranged facing towards a bulk acoustic resonant structure at this time), so that a through-silicon via (TSV) process can be used to form corresponding through holes in a subsequent. Then, a photolithography process (including photoresist coating, exposure, development, etc.) combined with a silicon etching process is used to etch and remove a portion of a thickness of the second substrate 300 to etch the second substrate 300, to form a groove 300a, such that a height of a sidewall of the groove 300a is uniform (that is, a top surface of the second substrate 300 around the groove 300a is flush or substantially flush), and a depth of the groove 300a may be about 3 µm to about 10 µm, for example, about 6 µm.

It should be noted that when the bulk acoustic resonant structure 404 has the opening 404' exposing the first electrode 4041 so that a surface of the resonant cavity main structure 40 for bonding has a step height difference, the uniform height of the sidewall of the groove 300a can be maintained in step S2 (that is, the top surface of the second substrate 300 around the groove 300a is flush or substantially flush). When a formed resonator cover 30 and the resonant cavity main structure 40 are subsequently bonded together, a thickness of an elastic bonding material layer 301 at a bonding site is adaptively changed, and the step height difference of the resonant cavity main structure 40 is compensated, so that surfaces of the second substrate 300 and the first substrate 400 opposite to each other are maintained level. In some other embodiments of the present disclosure, when forming the groove in the second substrate 300, it can also be considered to compensate for at least a portion of the step height difference of the surface of the resonant cavity main structure 40 for bonding. Alternatively, referring to FIG. 4, considering that a bonding surface of the resonant cavity main structure 40 has the step height difference (that is, the step height difference H at the opening 404'), in step S2, two photolithography processes combined with silicon etching are used to form and etch the second substrate 300 to form a groove with uneven sidewall heights, that is, the top surface of the second substrate 300 around the formed groove is not flush. For example, the top surface of the second substrate 300 on one side of the groove is lower than the top surface of the second substrate 300 on another side of the groove. At this time, a sidewall 3002 of the groove formed in the second substrate 300 corresponds to the opening 404' of the resonant cavity main structure 40, and a sidewall 3001 corresponds to an area outside the opening 404' of the resonant cavity main structure 40. A height difference h between the sidewall 3002 and the sidewall 3001 can be equal to H, or less than H, or greater than H. When the height difference h between the sidewall 3002 and the sidewall 3001 is not equal to H, and when the formed resonator cover 30 and the resonant cavity main structure 40 are subsequently bonded together, the thickness of the elastic bonding material layer 301 at the bonding site can still be adaptively changed to compensate for the step height difference of the bonding surface, to finally make the surfaces of the second substrate 300 and the first substrate 400 opposite to each other remain level.

Figure 4:
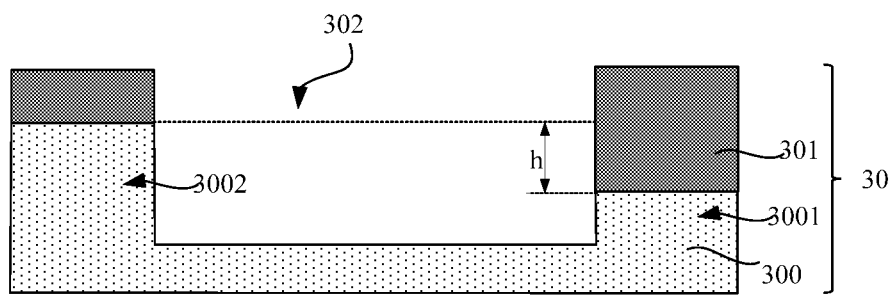
FIG. 4 illustrates a schematic cross-sectional structure diagram of an exemplary resonator cover according to some other embodiments of the present disclosure.

Referring to FIGS. 3B and 4, in step S2, then, the second substrate 300 and the groove 300a are covered with the elastic bonding material layer 301 having elasticity. A material selected for the elastic bonding material layer 301 needs to be able to: be patterned, be cured under certain conditions, stably adhere to materials of upper and lower layers, and be elastic, to tolerate a certain amount step height difference during subsequent wafer bonding. Therefore, the material of the bonding material layer 301 can be a photo-curable material, a heat-curable material, or a combination of the photo-curable material and the heat-curable material, whose elasticity can be removed by light, and cooling after heating, such as a dry film. Optionally, a fluid dry film photoresist material can be coated by a coating process (such as spin coating, spray coating, roll coating or screen printing), or a solid or semi-solid dry film material can be pressed by a laminator, onto the second substrate 300 and the groove 300a, to form the elastic bonding material layer 301. For example, using the laminator, the solid dry film material is attached to the second substrate 300 to form the elastic bonding material layer 301 at about 80° C. to about 120° C. (for example, about 110° C.) and in a vacuum state. The elastic bonding material layer 301 may have a three-layer structure, for example, one layer is a PE protective layer, a middle layer is a dry film layer, and another layer is a PET protective layer. The PE protective layer is a film layer based on a special polyethylene (PE) plastic film, such as a high-density polyethylene protective film, a medium-density polyethylene film, and a low-density polyethylene film. A full name of the PET protective layer is polyethylene terephthalate, which is obtained by a condensation polymerization of terephthalic acid and ethylene glycol. Both the PE protective layer and the PET protective layer only play a protective role and will be removed before lamination and development. Therefore, the middle dry film layer is finally sandwiched between the second substrate 300 and the first substrate 400, and has certain viscosity and good photosensitivity. A thickness of the elastic bonding material layer 301 is about 3 µm to about 5 Then, through a series of photolithography processes including exposure and development, the elastic bonding material layer 301 is patterned, and the elastic bonding material layer 301 is left only at a periphery of the groove 300a to form the second cavity 302. At this time, the second cavity 302 substantially includes the groove 300a and a space 301a surrounded by the remaining elastic bonding material layer 301 (also referred to as a portion of the second cavity 302 located in the elastic bonding material layer 301). Alternatively, the elastic bonding material layer 301 is formed with a mask, performed with ultraviolet exposure under vacuum conditions, and left for a while after the exposure. A radiation dose of the ultraviolet exposure is preferably about 200 mJ/cm$^2$ to about 300 mJ/cm$^2$. Next, the exposed elastic bonding material layer 301 is pre-baked for about 100 seconds to about 300 seconds (such as about 200 seconds) at a temperature of about 100° C. to about 150° C. (for example, about 130° C.). Then, at a room temperature (i.e., a natural environment temperature), the pre-baked elastic bonding material layer 301 is spin-sprayed multiple times (for example, 3 times) with a developing solution to develop the pre-baked elastic bonding material layer 301 to form the elastic bonding material layer 301 with the second cavity 302. The developer is PGMEA, and its components include propylene glycol methyl ether acetate, and a molecular formula of propylene glycol methyl ether acetate is $C_6H_{12}O_3$, which can make the development process of the elastic bonding material layer 301 be performed at the room temperature, and the elastic bonding material layer 301 on a sidewall and bottom wall of the groove 300a can be removed, so that the remaining elastic bonding material layer 301 is only located on the second substrate 300 at the periphery of the groove 300a. So far, fabrication of the resonator cover 30 is completed. A shape and size of the second cavity 302 may be the same as those of the first cavity 402, or not exactly the same, as long as the second cavity 302 can enable that after the subsequent resonant cavity main structure 40 and the resonator cover 30 are bonded together, the first electrode layer 4041, the piezoelectric layer 4042, and the second electrode layer 4043 of the bulk acoustic resonant structure 404 have portions that overlap the first cavity 402 and the second cavity 302 at a same time, thereby forming an effective resonance area of the resonator.

It should be noted that, as shown in FIG. 3B, when the height of the sidewall of the groove 300a is uniform, the thickness of the remaining elastic bonding material layer 301 in a direction perpendicular to the surface of the second substrate 300 is also uniform. As shown in FIG. 4, when the height of the sidewall of the groove 300a is not uniform, the thickness of the remaining elastic bonding material layer 301 in the direction perpendicular to the surface of the second substrate 300 is also not uniform, but a surface of the remaining elastic bonding material layer 301 facing away from the second substrate 300 is substantially flush, thereby helping to reduce process difficulty during subsequent bonding, especially difficulty in alignment of the first cavity and the second cavity during the bonding. In some other embodiments of the present disclosure, when the height of the sidewall of the groove 300a is not uniform and the height difference of the sidewall of the groove is h=H, the thickness of the remaining elastic bonding material layer 301 in the direction perpendicular to the surface of the second substrate 300 may also be uniform. In this case, when the formed resonator cover 30 and the resonant cavity main structure 40 are subsequently bonded together, the uneven sidewall height of the groove 300a may be used to compensate the step height difference of the bonding surface of the resonant cavity main structure 40, and finally the surfaces of the second substrate 300 and the first substrate 400 opposite to each other are kept level.

In addition, it should be noted that the process of fabricating the resonator cover 30 in the above step S2 is not limited to the above solution. In some other embodiments of the present disclosure, an elastic bonding material layer can also be formed fully covering on a provided second substrate. Then through a photolithography and etching process, the elastic bonding material layer and a portion of a thickness of the second substrate are sequentially patterned to form the resonator cover 30 with the second cavity. Thus, the process can be simplified, and the process difficulty of covering and removing an excess elastic bonding material layer can be avoided.

Figure 3C:
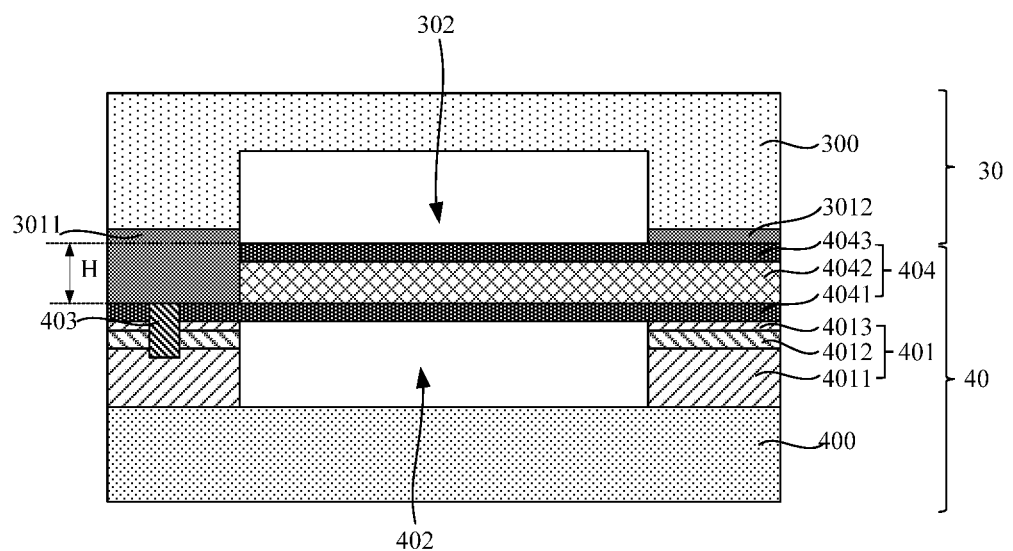

Referring to FIG. 3C, in step S3, an opening of the second cavity 302 is placed towards the bulk acoustic resonant structure 404 (that is, the elastic bonding material layer 301 is placed facing towards the bonding surface of the resonant cavity main structure 40), the second cavity 302 is at least partially aligned with the first cavity 402. And then through the elastic bonding material layer 301, the second substrate 300, the bulk acoustic resonant structure 404, and the lower cavity wall 401 are bonded together. A meaning that the second cavity 302 is at least partially aligned with the first cavity 402 includes the following situations: when shapes and sizes of openings of the second cavity 402 and the first cavity 302 facing towards each other are the same, the second cavity 302 is substantially completely aligned with the first cavity 402 (that is, the groove 300a and the first cavity 402 are directly opposite, and centers of the two are coincident); and when the shapes and sizes of the openings of the second cavity 402 and the first cavity 302 facing towards each other are not exactly the same, the second cavity 302 is partially aligned with the first cavity 402 (that is, the groove 300a and the first cavity 402 are partially aligned with each other, and the centers of the two can be misaligned). In addition, the bulk acoustic resonant structure 404 has the opening 404' exposing the first electrode 4041 (that is, the corresponding electrical connection portions of the bulk acoustic resonant structure 404) in the area outside the first cavity 402, and the opening 404' causes the bulk acoustic resonant structure 404 to have a step with a height H. A subsequent first through hole will be formed in the area of the opening 404'. In some embodiments, the second substrate 300 and the resonant cavity main structure 40 are bonded together by force pressing (that is, the second substrate 300 is bonded to the bulk acoustic resonant structure 404 and its exposed lower cavity wall 401 through the elastic bonding material layer 301), the thickness of the elastic bonding material layer 301 can be adaptively changed with the step at the opening 404', and at a same time the surfaces of the second substrate 300 and the first substrate 400 opposite to each other are kept level. At this time, the elastic bonding material layer 301 adapting the difference in step height due to its own elasticity includes two portions: one portion is bonded to surfaces of the first electrode 4041 and the alignment mark 403 exposed by the opening 404' to form a first upper cavity wall 3011 with a larger height, and the other portion is bonded to a surface of the second electrode 4043 at the periphery of the first cavity 402 opposite to the first upper cavity wall 3011 to form a second upper cavity wall 3012 with a smaller height. A height difference between the first upper cavity wall 3011 and the second upper cavity wall 3012 facing towards the first substrate 400 is H, and surfaces of the first upper cavity wall 3011 and the second upper cavity wall 3012 facing towards the second substrate 300 are flush or nearly flush. The second substrate 300 and the first substrate 400 are bonded together by viscosity of the elastic bonding material layer 301 of the first upper cavity wall 3011 and the second upper cavity wall 3012, and molecular bonding force between the elastic bonding material layer 301 and the bulk acoustic resonant structure. This bonding process is simple, does not affect the performance of the first cavity 402 and the second cavity 302, and can tolerate a certain step height difference between the area around the first cavity 402 and the bulk acoustic resonant structure 404 on the first substrate 400, so that after the second substrate 300 and the first substrate 400 are bonded together, problems of the second substrate tilting on a side facing away from the first substrate and unreliable bonding caused by the step height difference can be avoided. Optionally, process conditions for bonding the resonator cover 30 and the resonant cavity main structure 40 include: a bonding pressure of about 1 Pa to about $10^5$ Pa, vacuum bonding, a temperature of about 150° C. to about 200° C. (for example, about 150° C.), and a pressure time of about 20 min to about 30 min, so as to avoid affecting the resonance performance of the product under the premise of ensuring the bonding performance. After the bonding is completed, the elastic bonding material layer 301 is cured by light, and cooling after heating, that is, elasticity of the elastic bonding material layer 301 is removed, so that the resonator cover 30 and the resonant cavity main structure 40 are reliably bonded together. A process of curing the elastic bonding material layer 301 can be a high-temperature curing process (i.e., cooling after heating), a curing temperature is about 180° C. to about 220° C. (for example, about 190° C.), and a curing time is about 1.5 hours to about 2 hours (for example, about 2 hours). In some other embodiments of the present disclosure, the process of curing the elastic bonding material layer 301 can also be a UV curing process, and a radiation dose of the UV curing can be selected from about 200 mJ/cm$^2$ to about 300 mJ/cm$^2$, and the light is the same as the light used in the ultraviolet exposure process to pattern the elastic bonding material layer 301 to simplify the process and reduce the cost.

In some other embodiments of the present disclosure, when the height of the sidewall of the groove in the second substrate 300 is not uniform, and when the resonator cover 30 and the resonant cavity main structure 40 are bonded together in step S3, an amount of adaptive change in the thickness of the elastic bonding material layer 301 will be different, but a final result can make the bonding reliable and the surfaces of the second substrate 300 and the first substrate 400 opposite to each other after the bonding remain level, thus providing a flat process window for subsequent fabrication of a conductive interconnect layer.

Figure 3D:
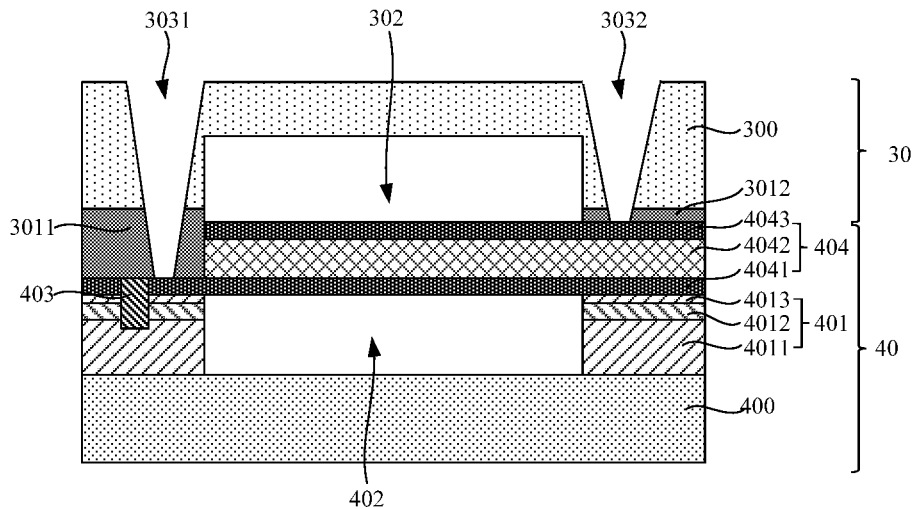

In step S4, first, referring to FIG. 3D, through a chemical mechanical polishing (CMP) process, the second substrate 300 is thinned from the side of the second substrate 300 facing away from the bulk acoustic resonant structure 404. For example, a thickness of the second substrate 300 is reduced to about 60 μm to about 80 Then, a through-silicon via (TSV) etching process is used to open a through hole from the side of the second substrate 300 facing away from the bulk acoustic resonant structure 404 at the first upper cavity wall 3011 to penetrate the first upper cavity wall 3011 and expose a portion of the first electrode 4041 at the opening 404', to form a first through hole 3031; and open a through hole from the side of the second substrate 300 facing away from the bulk acoustic resonant structure 404 at the second upper cavity wall 3012 to penetrate the second upper cavity wall 3012 and expose a portion of the second electrode 4043, to form a second through hole 3032. The portion of the first electrode 4041 extending out of the first cavity 402 exposed by the first through hole 3031 is referred to as a first electrical connection portion, and the portion of the second electrode 4043 extending out of the first cavity 402 exposed by the second through hole 3032 is referred to as a second electrical connection portion. Alternatively, the second substrate 300 at the first upper cavity wall 3011 and the first upper cavity wall 3011 may be sequentially etched through exposure, development, and etching processes to form the first through hole 3031, and the etching process to form the first through hole 3031 stops when the first electrode 4041 is exposed. The second substrate 300 at the second upper cavity wall 3012 and the second upper cavity wall 3012 are etched through exposure, development and etching processes to form the second through hole 3032, and the etching process to form the second through hole 3032 stops when the second electrode 4043 is exposed. In some other embodiments of the present disclosure, the second through hole 3032 may be formed before the first through hole 3032 is formed. Sizes of the first through hole 3031 and the second through hole 3032 can be determined according to an electrode range to be exposed and the etching conditions. In some embodiments, an opening diameter of the first through hole 3031 and the second through hole 3032 is about 20 μm to about and a depth of the first through hole 3031 and the second through hole 3032 is about 60 μm to about 100 μm.

Figure 3E:
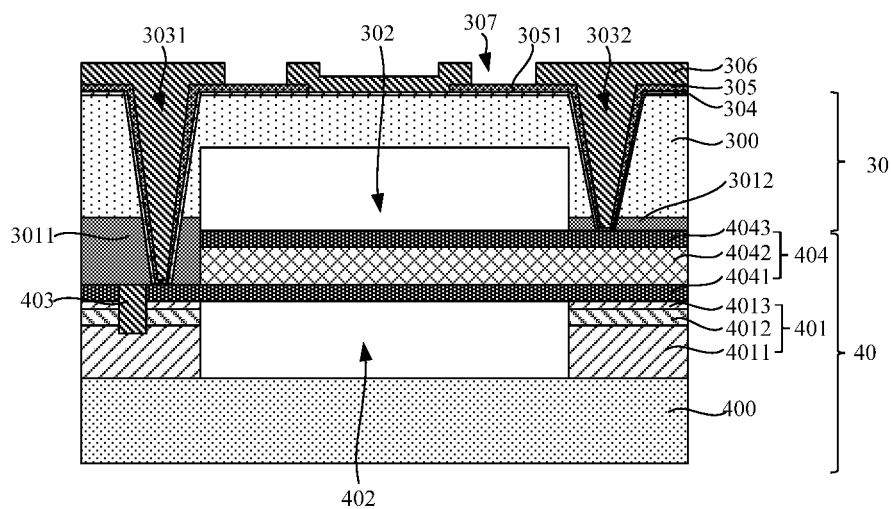

Referring to FIG. 3E, in step S5, first, a diffusion barrier layer 304 may be deposited by using sputtering, plasma physical vapor deposition, high-density plasma chemical vapor deposition, low-pressure chemical vapor deposition, atomic layer deposition, etc. Since a deposition process is used to form the diffusion barrier layer 304, the diffusion barrier layer 304 is not only formed on inner surfaces of the first through hole 3031 and the second through hole 3032, but also covers the side of the second substrate 300 facing away from the bulk acoustic resonant structure 404. The diffusion barrier layer 304 can optionally be a laminated structure, including a nitride layer (not shown) for electrically insulating and isolating a subsequently formed conductive interconnection layer 305 from the second substrate 300 and an adhesion barrier layer (not shown) laminated on a surface of the nitride layer. A material of the adhesion barrier layer includes at least one of Al, Au, Cr, Co, Ni, Cu, Mo, Ti, Ta, W, Pt, and the like. The plasma physical vapor deposition, high-density plasma chemical vapor deposition, low-pressure chemical vapor deposition, and atomic layer deposition have better step coverage, which can prevent formation of the diffusion barrier layer 304 from filling the first through hole 3031 and the second through hole 3032. Then the diffusion barrier layer 304 at bottoms of the first through hole 3031 and the second through hole 3032 is etched away to expose the first electrode 4041 and the second electrode 4043 on bottom walls of the first through hole 3031 and the second through hole 3032. At this time, a surface of the second substrate 300 around the first through hole 3031 and the second through hole 3032 is still covered with the diffusion barrier layer to realize electrical insulation between the subsequent conductive interconnection layer in the first through hole 3031 and the second through hole 3032.

Continuing to refer to FIG. 3E, in step S5, then, processes including sputtering, electroplating, plasma physical vapor deposition, high-density plasma chemical vapor deposition, low-pressure chemical vapor deposition, atomic layer deposition, etc., can be used for through hole metallization, to form the conductive interconnection layer 305. At this time, the conductive interconnection layer 305 covers the diffusion barrier layer 304 and the exposed bottom walls of the first through hole 3031 and the second through hole 3032. A material of the conductive interconnection layer 305 can be selected to be the same as the material of the second electrode and the first electrode, and the deposition process conditions and the subsequent etching process conditions are also the same, so that the process of step S1 can be compatible to a greatest extent and the processes are simplified. In addition, in some other embodiments of the present disclosure, the material of the conductive interconnection layer 305 may include at least one of Ti, Ta, W, Mo, Cu, W, and the like. Then, a portion of the conductive interconnection layer 305 on the surface of the second substrate 300 facing away from the first substrate 400 is removed by exposure, development, and etching processes to pattern the conductive interconnection layer 305 to form a patterned conductive interconnection layer 305 which is electrically connected to the second electrode 4043 and the first electrode 4041 respectively.

Referring to FIG. 3E, in step S6, first, processes including sputtering, electroplating, plasma physical vapor deposition, high-density plasma chemical vapor deposition, low-pressure chemical vapor deposition, atomic layer deposition, etc., can be used on the conductive interconnection layer 305 in the first through hole 3031 and the second through hole 3032 and on the surface of the second substrate 300 facing away from the first substrate 400, and on the surface of the second substrate 300 exposed by the conductive interconnection layer 305, to deposit a passivation layer 306. A thickness of the deposited passivation layer 306 is sufficient to fill the first through hole 3031 and the second through hole 3032. Optionally, a material of the passivation layer 306 is the same as the piezoelectric layer 4042, and an exact same deposition process as the piezoelectric layer 4042 is used, so that it is compatible with the process of the resonant cavity main structure 40 to a maximum extent, and at the same time, it can avoid problems of temperature drift and introducing unnecessary stress caused by using other materials to make the passivation layer, which improves the resonance performance of the resonator. Next, the passivation layer 306 is patterned by exposure, development, and etching processes to form contact openings 307, that process conditions for the patterned passivation layer 306 can be exactly the same as the process conditions for the patterned piezoelectric layer 402, and it is compatible with the process of the resonant cavity main structure 40 to a greatest extent. The contact openings 307 can expose a portion of the conductive interconnection layer 305 on the surface of the second substrate 300 facing away from the first substrate 400 to form conductive contact pads 3051, and the conductive contact pads 3051 include a conductive contact pad electrically connected to the first electrode 4041 and a conductive contact pad electrically connected to the second electrode 4043. At this time, the passivation layer 306 also fills the first through hole 3031 and the second through hole 3032 to enhance mechanical support performance of an upper cavity wall 301.

It should be noted that, in some other embodiments of the present disclosure, the above steps S1 and S2 can also be performed at a same time, or step S2 is performed first and then step S1 is performed. In addition, in some other embodiments of the present disclosure, other passivation materials may also be used to form the passivation layer 306. These passivation materials include at least one of silicon oxide, silicon nitride, silicon oxynitride, metal nitride, and polymer.

As such, the packaging method of the FBAR according to the present disclosure not only has characteristics of low cost, simple process, and high compatibility with the process of the resonant cavity main structure, but also does not cause pollution problems of the Au—Au bonding process. And it can tolerate a certain step height difference of the bulk acoustic resonant structure at the periphery of the first cavity, ensuring the reliability and stability of the bonding. Moreover, since the main structures required on the resonator cover are all completed on the second substrate, the influence on the first cavity can be minimized. More importantly, after the resonator cover is bonded to the resonant cavity main structure, the second cavity substantially includes the groove in the second substrate and the space surrounded by the elastic bonding material layer, which can avoid that the performance of the elastic bonding material layer is unstable due to changes in temperature and humidity, when the second cavity is entirely surrounded by the elastic bonding material layer, that is, the stability of the resonator is improved.

Referring to FIGS. 3A to 3E, the embodiments of the present disclosure also provide a packaging structure of an FBAR manufactured by the packaging method of an FBAR according to the present disclosure. The packaging structure of the FBAR includes a resonant cavity main structure 40 and a resonator cover 30. The resonant cavity main structure 40 includes a first substrate 400, a bulk acoustic resonant structure 404, and a first cavity 402. The resonator cover includes a second substrate 300 with a groove 300a, an elastic bonding material layer 301 with elasticity removed that surrounds a portion space 301a of the second cavity 302, a first through hole 3031 and a second through hole 3032, a conductive interconnection layer 305, and a patterned passivation layer 306. The bulk acoustic resonant structure 404 is formed on the first substrate 400, and the first cavity 402 is sandwiched between the bulk acoustic resonant structure 404 and the first substrate 400. The second substrate 300 is disposed above the bulk acoustic resonant structure 404, and the elastic bonding material layer 301 is sandwiched between the second substrate 300 and the bulk acoustic resonant structure 404, and is formed at a periphery of the groove 300a on the second substrate 300. The second cavity 302 is substantially formed by a combination of the groove 300a and the space 301a surrounded by the elastic bonding material layer 301, and the second cavity 302 and the first cavity 402 are at least partially aligned with each other. The first through hole 3031 and the second through hole 3032 are both located at a periphery of the first cavity 402 and the second cavity 302, penetrate the resonator cover, and expose corresponding electrical connection portions of the bulk acoustic resonant structure. The conductive interconnection layer 305 covers inner surfaces (including sidewalls and bottom walls) of the first through hole 3031 and the second through hole 3032, and extends continuously from the sidewalls of the first through hole 3031 and the second through hole 3032 to a portion of a surface of the second substrate 300 facing away from the bulk acoustic resonant structure 404, that is, the conductive interconnection layer 305 is formed on the inner surfaces of the first through hole 3031 and the second through hole 3032 and on the portion of the surface of the resonator cover at a periphery of the first through hole 3031 and the second through hole 3032. The patterned passivation layer 306 fills the first through hole 3031 and the second through hole 3032 and covers a portion of the conductive interconnection layer 305 on the surface of the second substrate 300 facing away from the bulk acoustic resonant structure 404, and the conductive interconnection layer 305 exposed by the patterned passivation layer 306 forms corresponding conductive contact pads.

In some embodiments, the bulk acoustic resonant structure 404 has a first electrode 4041, a piezoelectric layer 4042, and a second electrode 4043 that are sequentially stacked on the first substrate 400, and a first cavity 402 is formed between the first substrate 400 and the first electrode 4041, and surrounded by a lower cavity wall 401. In some embodiments, the lower cavity wall 401 is a support layer made of different materials from the first substrate 400 and the bulk acoustic resonant structure 404 (i.e., a first lower cavity wall layer 4011 to a third lower cavity wall layer 4013 in FIGS. 3E and 4). The first substrate 400 and the bulk acoustic resonant structure 404 are bonded together through the support layer, and the first cavity 402 is formed in the support layer. The elastic bonding material layer 301 with elasticity removed is formed on the support layer at a periphery of the first cavity 402. In some other embodiments of the present disclosure, the first cavity 402 may be a groove structure with an entire bottom recessed in the first substrate 400. In this case, the lower cavity wall 401 is the first substrate 400 around the groove, or, the first cavity 402 is a cavity structure projected on a surface of the first substrate 400 as a whole. In both cases, the elastic bonding material layer 301 with elasticity removed is formed on the first substrate 400 around the first cavity 402.

The second substrate 300 is bonded together with the bulk acoustic resonant structure 404, the exposed lower cavity wall 401, and an alignment mark 403, through the elastic bonding material layer 301, that is, the bulk acoustic resonant structure 404 and the second substrate 300 are connected by the elastic bonding material layer 301. The second cavity 302 and the first cavity 402 are at least partially aligned with each other. At this time, a portion of the bulk acoustic resonant structure 404 is confined between the second cavity 302 and the first cavity 402 (that is, the portion of the bulk acoustic resonant structure 404 overlaps the second cavity 302 and the first cavity 402 to form a main body area of the bulk acoustic resonant structure 404 for resonance).

Since the bulk acoustic resonant structure 404 of some embodiments includes the first electrode 4041 and the second electrode 4043, in some embodiments, the first through hole 3031 penetrates from a surface of the second substrate 300 facing away from the bulk acoustic resonant structure 404 to expose a portion of a surface of the first electrode 4041, and the second through hole 3032 penetrates from the surface of the second substrate 300 facing away from the bulk acoustic resonant structure 404 to expose a portion of a surface of the second electrode 4043. In other words, in some embodiments, the electrical connection portions of the bulk acoustic resonant structure 404 include: a first electrical connection portion, including a portion of the first electrode 4041 extending out of the first cavity; and a second electrical connection portion, including a portion of the second electrode 4043 extending out of the first cavity.

In some embodiments, the patterned passivation layer 306 covering the surface of the second substrate 300 facing away from the bulk acoustic resonant structure 404 has contact openings 307 that expose a corresponding portion of the conductive interconnection layer 305. The portion of the conductive interconnection layer 305 exposed by the contact openings 307 forms conductive contact pads 3051. The conductive interconnection layer 305 is electrically connected to the second electrode 4043 and the first electrode 4041, respectively, for leading out the second electrode 4043 and the first electrode 4041 through corresponding conductive contact pads 3051.

In some embodiments, the second substrate 300 may optionally be a substrate including a silicon base substrate, for example, a bulk silicon substrate, a silicon-on-insulator substrate, a silicon base substrate covered with a silicon dioxide layer, so that the first through hole 3031 and the second through hole 3032 can be fabricated by a through-silicon via process, thereby simplifying the process and reducing the process cost.

In some embodiments, a material selected for the elastic bonding material layer 301 needs to be able to: be patterned, be cured under certain conditions, stably adhere to materials of upper and lower layers, and be elastic to tolerate a certain step height difference when sequentially bonding a wafer. Therefore, the material of the elastic bonding material layer 301 can be a photo-curable material, a heat-curable material, or a combination of the photo-curable material and the heat-curable material, whose elasticity can be removed by light, and cooling after heating, such as a dry film.

In some embodiments, the bulk acoustic resonant structure 404 has an opening 404' at the periphery of the first cavity 402 that exposes a portion of the first electrode 4041, a shape of the opening 404' is a closed ring or semi-ring, etc., and a height of a step formed on the bulk acoustic resonant structure 404 at the opening 404' is uniform, H. A height of a sidewall of the groove 300a is uniform (that is, a top surface of the second substrate 300 around the groove 300a is flush or substantially flush), a thickness of the elastic bonding material layer 301 between the second substrate 300 and the first substrate 400 can adapt to the step height of the bulk acoustic resonant structure 404, and at a same time, surfaces of the second substrate 300 and the first substrate 400 opposite to each other can be maintained level to facilitate integration of the formed bulk acoustic resonator product and other products on a same printed circuit board.

In some other embodiments of the present disclosure, the height of the sidewall of the groove 300a is not uniform. As shown in FIG. 4, a sidewall 3002 and a sidewall 3001 of the groove have a height difference h, which can be equal to H, or smaller than H, or greater than H. When the height difference h between the sidewall 3002 and the sidewall 3001 is not equal to H, the thickness of the elastic bonding material layer 301 at a bonding site after the resonator cover 30 and the resonant cavity main structure 40 are bonded together adaptively changes and is uneven to compensate for the step height difference of the bonding surface, and finally make the surfaces of the second substrate 300 and the first substrate 400 opposite to each other remain level. When h=H, after the resonator cover 30 and the resonant cavity main structure 40 are bonded together, the thickness of the elastic bonding material layer 301 at the bonding is uniform, and the height difference h of the sidewall of the groove can just compensate for the step height difference of the bonding surface, and finally make the surfaces of the second substrate 300 and the first substrate 400 opposite to each other remain level.

In addition, in some embodiments of the present disclosure, the passivation layer 306 and the piezoelectric layer 4042 are made of a same material, and a deposition process and etching process are also the same to maximize compatibility with the first cavity process, and at a same time problems of temperature drift and introducing unnecessary stress caused by using other materials to make the passivation layer are avoided, thereby improving the resonance performance of the resonator. In some other embodiments of the present disclosure, other passivation materials can also be used to form the passivation layer 306. These passivation materials include at least one of silicon oxide, silicon nitride, silicon oxynitride, metal nitride, and polymer.

In addition, in some embodiments, the alignment mark 403 is also formed in the lower cavity wall 401 between the first substrate 400 and the first electrode 4041 for surrounding the first cavity 402, so the alignment mark 403 penetrates the bulk acoustic resonant structure 404 and is bonded to the elastic bonding material layer 301. The alignment mark 403 can determine an alignment position and degree of alignment of the second cavity 302 and the first cavity 402 during the process of bonding the resonant cavity main structure 40 and the resonator cover 30.

It should be noted that since the packaging structure of the FBAR according to some embodiments is made by the packaging method of the FBAR according to the present disclosure, the material, size and other parameters of each structure can refer to the content of the above-mentioned packaging method of the FBAR, and will not be repeated here.

The packaging structure of the FBAR according to the present disclosure can improve the resonance performance of the resonator, and can be manufactured by the packaging method of the FBAR according to the present disclosure to simplify the process and reduce the cost.

Compared with existing technology, the technical solutions of the present disclosure have the following beneficial effects.

In the packaging method according to the present disclosure, the second cavity in the resonator cover provided includes the groove in the second substrate and the space surrounded by the elastic bonding material layer. The resonator cover is directly bonded to the resonant cavity main structure through the elastic bonding material layer, and elasticity of the elastic bonding material layer is removed after the bonding. And then the corresponding through holes and the conductive interconnect layer on the inner surfaces of the through holes can be formed on the resonator cover. Since after the resonator cover is bonded to the resonant cavity main structure substantially, the second cavity includes the groove in the second substrate and the space surrounded by the elastic bonding material layer on the second substrate, it can avoid that the performance of the elastic bonding material layer is unstable due to changes in temperature and humidity, when the second cavity is entirely surrounded by the elastic bonding material layer, that is, the stability of the resonator is improved.

The packaging method according to the present disclosure not only has the characteristics of low cost, simple process, and high compatibility with the resonant cavity main structure, but also because the second substrate and the resonant cavity main structure are bonded together through the elastic bonding material layer, it will not cause pollution problems of the Au—Au bonding process.

In the packaging method according to the present disclosure, since the main contact area when the resonator cover and the resonant cavity main structure are bonded together is the elastic bonding material layer outside the second cavity, and the elastic bonding material layer has certain elasticity, the packaging method according to the present disclosure can realize the bonding between the resonator cover and the resonant cavity main structure by pressing the two. The bonding process is simple, and the performance of the first cavity and the second cavity is not affected. The elasticity of the elastic bonding material layer can be used to change its thickness to adapt to the step height of the bulk acoustic resonant structure at the periphery of the first cavity, thereby tolerating a certain step height difference on the bulk acoustic resonant structure on the resonant cavity main structure at the periphery of the first cavity. When the resonator cover and the resonant cavity main structure are bonded together, not only the side of the second substrate facing away from the first substrate does not tilt, but also the step height difference of the bulk acoustic resonant structure is compensated to ensure the reliability and stability of the bonding. Moreover, because the surface of the second substrate facing away from the first substrate is level, a flat process window can be provided for the manufacturing process of the conductive interconnection layer, thereby ensuring the performance of the formed conductive interconnection layer.

In the packaging method according to the present disclosure, the main structures required on the resonator cover, such as the through holes, the conductive interconnection layer, the passivation layer, conductive contact pads, etc., are all fabricated on the second substrate side, thus, the impact on the first cavity is minimized.

In the packaging method according to the present disclosure, the same material as the piezoelectric layer in the bulk acoustic resonant structure can be selected to form the passivation layer, which can be compatible with the first cavity process to the greatest extent, and can avoid the problems of temperature drift and introducing unnecessary stress caused by using other materials for the passivation layer, thereby improving the resonance performance of the resonator. In addition, the passivation layer fills the corresponding through holes, which can enhance the mechanical strength of the resonator cover, thereby increasing the supporting force of the sidewall of the second cavity of the resonator, and preventing the deformation of the second cavity from affecting resonance performance and reliability of the resonator.

When the second substrate of the resonator cover includes a silicon substrate, a through-silicon via process can be used to form the required through holes on the resonator cover, to form the conductive interconnection layer and conductive contact pads, thereby simplifying the process, reducing process cost, and preventing the process of leading out the first electrode and the second electrode of the bulk acoustic resonant structure through the through holes from polluting the device.

Those skilled in the art can make various changes and modifications to the present disclosure without departing from the spirit and scope of the present disclosure. In this way, if these modifications and variations of the present disclosure fall within the scope of the claims of the present disclosure and their equivalent technologies, the present disclosure is also intended to include these modifications and variations.

What is claimed is:

1. A packaging method of a film bulk acoustic resonator, comprising:
    providing a resonant cavity main structure, wherein the resonant cavity main structure includes
        a first substrate,
        a bulk acoustic resonant structure, and
        a cavity wall structure between the first substrate and the bulk acoustic resonant structure and enclosing a first cavity between the bulk acoustic resonant structure and the first substrate,
        wherein an opening is formed in the bulk acoustic resonant structure and outside the first cavity;
    providing a resonator cover, wherein the resonator cover includes a second substrate and an elastic bonding material layer on the second substrate, and a second cavity is formed in the second substrate and through the elastic bonding material layer;
    bonding the resonant cavity main structure and the resonator cover together by force pressing the elastic bonding material layer, such that
        a first portion of the elastic bonding material layer of the resonator cover is adaptively pressed into the opening in the bulk acoustic resonant structure of the resonant cavity main structure,
        a second portion of the elastic bonding material layer of the resonator cover is adaptively pressed on a top surface of the bulk acoustic resonant structure of the resonant cavity main structure; and
    forming a first through hole penetrating the first portion of the elastic bonding material layer and the second substrate, and
    forming a second through hole penetrating the second portion of the elastic bonding material layer and the second substrate, the first and second through holes exposing a first electrical connection portion and a second electrical connection portion of the bulk acoustic resonant structure.

2. The packaging method according to claim 1, wherein:
    providing the resonator cover includes: providing the second substrate and removing a portion of the second substrate to form a groove therein; forming an elastic bonding material on surfaces of the second substrate and in the groove; and patterning the elastic bonding material to remove the elastic bonding material on sidewalls and a bottom wall of the groove, wherein the patterned elastic bonding material forms the elastic bonding material layer with the second cavity passing through the elastic bonding material layer; or providing the resonator cover includes: providing the second substrate and forming the elastic bonding material layer on the second substrate; and sequentially patterning the elastic bonding material layer and the second substrate, thereby forming the second cavity in the second substrate and through the elastic bonding material layer.

3. The packaging method according to claim 1, further comprising:
removing elasticity of the elastic bonding material layer, after bonding the resonant cavity main structure and the resonator cover together through the elastic bonding material layer by force pressing, by performing
a light illumination, or a heating and cooling process.

4. The packaging method according to claim 1, wherein:
the first portion of the elastic bonding material layer has a first thickness, and
the second portion of the elastic bonding material layer has a second thickness, the second thickness being less than the first thickness.

5. The packaging method according to claim 1, wherein:
the bulk acoustic resonant structure includes a first electrode adjacent to the first substrate, a piezoelectric layer on the first electrode, and a second electrode on the piezoelectric layer.

6. The packaging method according to claim 5, wherein:
the first electrical connection portion includes a portion of the first electrode extending out of the first cavity; and
the second electrical connection portion includes a portion of the second electrode extending out of the first cavity.

7. The packaging method according to claim 1, wherein:
the opening formed in the bulk acoustic resonant structure and outside the first cavity exposes at least a portion of the first electrical connection portion; and
top surfaces of: the first portion of the first elastic bonding material layer formed in the opening and the second portion of the elastic bonding material layer formed on the top surface of the bulk acoustic resonant structure, are leveled with each other along a lateral direction of the first or second substrate.

8. The packaging method according to claim 1, further comprising:
after bonding the resonant cavity main structure and the resonator cover together and before forming the first and second through holes, thinning the second substrate, and
forming a first conductive interconnection layer and a second conductive interconnection layer on sidewall and bottom of each of the first and second through holes and further on a portion of a surface of the resonator cover at a periphery of each through hole.

9. The packaging method according to claim 8, wherein after forming the first and second conductive interconnection layers, the method further includes:
forming a first passivation layer on the first conductive interconnection layer, filling in the first through hole, and exposing a portion of the first conductive interconnection layer over a surface of the resonator cover at a periphery of the first through hole, and the exposed portion of the first conductive interconnection layer over the resonator cover forms first conductive contact pads, forming a second passivation layer on the second conductive interconnection layer, filling in the second through hole, and exposing a portion of the second conductive interconnection layer over a surface of the resonator cover at a periphery of the second through hole, and the exposed portion of the second conductive interconnection layer over the resonator cover forms second conductive contact pads, and
the first passivation layer has a thickness greater than the second passivation layer.

10. The packaging method according to claim 9, wherein:
the passivation layer is made of at least one of silicon oxide, silicon nitride, silicon oxynitride, metal nitride, and polymer.

11. The packaging method according to claim 1, wherein providing the resonant cavity main structure includes:
providing a carrier substrate, and sequentially forming film layers for forming the bulk acoustic resonant structure and a support layer on the film layers;
etching the support layer to form a trench in the support layer;
providing the first substrate, and bonding the first substrate to the support layer; and
removing the carrier substrate to form the resonant cavity main structure.

12. The packaging method according to claim 11, further including:
before the support layer is formed on the film layers for forming the bulk acoustic resonant structure, or after the carrier substrate is removed, patterning the film layers to form the bulk acoustic resonant structure.

13. The packaging method according to claim 1, wherein providing the resonant cavity main structure includes:
providing the first substrate, and forming a sacrificial layer on a portion of the first substrate;
forming the bulk acoustic resonant structure on the sacrificial layer and the first substrate; and
removing the sacrificial layer to form the first cavity.

14. The packaging method according to claim 13, wherein:
forming the sacrificial layer on the portion of the first substrate includes: etching the first substrate to form a groove in the first substrate; and forming the sacrificial layer to fill the groove; or
forming the sacrificial layer on the portion of the first substrate includes: forming the sacrificial layer on the first substrate; and patterning the sacrificial layer to form the sacrificial layer protruding on the portion of the first substrate.

15. The packaging method according to claim 1, wherein:
the first through hole has a thickness greater than the second through hole.

16. The packaging method according to claim 1, further comprising:
forming an alignment mark partially in the cavity wall structure and in the bulk acoustic resonant structure and exposed by the opening, wherein the alignment mark is used for alignment of the second substrate and the first substrate.

* * * * *